(12) United States Patent
Wang et al.

(10) Patent No.: US 6,452,521 B1
(45) Date of Patent: Sep. 17, 2002

(54) MAPPING A DELTA-SIGMA CONVERTER RANGE TO A SENSOR RANGE

(75) Inventors: Feng Wang, Roseville; Michael J. Gaboury, Burnsville, both of MN (US)

(73) Assignee: Rosemount Inc., Eden Prairie, MN (US)

( * ) Notice: Subject to any disclaimer, the term of this patent is extended or adjusted under 35 U.S.C. 154(b) by 0 days.

(21) Appl. No.: 09/808,516

(22) Filed: Mar. 14, 2001

(51) Int. Cl.[7] .............................. H03M 1/62; H03M 1/84
(52) U.S. Cl. ........................................ 341/139; 341/143
(58) Field of Search ................................. 341/143, 155, 341/139

(56) References Cited

U.S. PATENT DOCUMENTS 6,111,529 A * 8/2000 Maulik et al. .............. 341/120
6,140,952 A 10/2000 Gaboury ...................... 341/143

* cited by examiner

*Primary Examiner*—Peguy JeanPierre
(74) *Attorney, Agent, or Firm*—Westman, Champlin & Kelly, P.A.

(57) ABSTRACT

A mapping circuit coupled to the integrator circuit of a delta-sigma converter to map the analog input range of the integrator to the analog out-put range of the sensor. The integrator circuit provides an integrator output to a controller to generate a digital output, which is in a digital output range representing the analog input range. A sensor input circuit includes a sensor having an analog sensor output range. The mapping circuit is coupled to the integrator circuit and is responsive to control signals from the controller to map the analog input range of the integrator to the analog output range of the sensor.

20 Claims, 4 Drawing Sheets

MAPPING A DELTA-SIGMA CONVERTER RANGE TO A SENSOR RANGE

CROSS-REFERENCE TO RELATED APPLICATION

This application is related to Application Ser. No. 09/217,872, filed Dec. 21, 1998 by Michael J. Gaboury for "Delta-Sigma Circuit With Pulse Width Modulated Offset" and assigned to the same Assignee as the present invention.

FIELD OF THE INVENTION

This invention relates to analog-to-digital converters used in industrial process control transmitters, and particularly to mapping an analog input range of a delta-sigma converter to the output range of an analog sensor.

BACKGROUND OF THE INVENTION

Various analog-to-digital (A/D) converters are known that convert the analog output of a sensor to a digital output. A/D converters generate a combination of duty cycle, timing, frequency or pulse counts that digitally represent the output of the sensor. One known type of A/D converter is a delta-sigma circuit, also known as sigma-delta, $\Delta\Sigma$, and $\Sigma\Delta$ circuits. Delta-sigma converters are balanced A/D converter circuits that are distinguished from other balanced A/D circuits by the provision of a balancing current to an integrator. The polarity of the balancing current is controlled by a clocked controller. The delta-sigma circuit is capable of producing high accuracy, high resolution analog-to-digital conversions over its analog input range. Delta-sigma circuits are often employed in industrial process control transmitters to convert an analog signal from the sensor to a digital signal so that information concerning the process variable can be transmitted to a central station remotely located from the transmitter.

In practice, however, a sensor, such as a strain gauge, will often have an output range that has a low level and is offset relative to the range of the converter. For example, a strain gauge. operates to provide an output having a range between 0 volts and some maximum sensor voltage (+Vmax), whereas the delta-sigma converter provides an output that ranges between a negative maximum voltage and a positive maximum voltage. When the sensor is directly coupled to the converter, there is a mismatch, and the half of the high resolution capability of the delta-sigma converter is lost for the sensor application.

To overcome this. loss of resolution, it is common to employ analog conditioning circuitry, such as amplifiers and offset circuits, between the sensor output and the input of the delta-sigma converter. The conditioning circuitry, however, together with noise and temperature drift associated with the measurement, adversely affect the high accuracy of the delta-sigma converter for the sensor application. Moreover, only a limited amount of power is available to industrial process control transmitters, so the power consumed by the conditioning circuitry diminishes the availability of power to the transmitter for other purposes. Accordingly, a method and circuit are needed that allow an analog sensor with a low level or offset analog output to be coupled directly to a delta-sigma converter having a higher level input range, to utilize substantially the full range of the delta-sigma converter without the inaccuracies of analog amplifying and offsetting circuits.

SUMMARY OF THE INVENTION

A delta-sigma converter includes a mapping circuit coupled to the integrator circuit to map the analog input range of the integrator to the analog output range of the sensor.

More particularly, an integrator circuit has an analog input range and provides an integrator output to a controller to generate a digital output. The digital output is in a digital output range representing the analog input range. A sensor input circuit includes a sensor having an analog sensor output range. The mapping circuit is coupled to the integrator circuit and is responsive to control signals from the controller to map the analog input range to the analog sensor range.

In preferred embodiments, the integrator circuit has at least two differentially arranged inputs. The sensor input circuit includes a pair of charge packet generators each coupled to a sensor capacitor to supply charges of opposite polarity to the integrator circuit inputs. The mapping input circuit includes a pair of charge packet generators each having a mapping capacitor and arranged to alter the charge supplied by the sensor first charge packet generators to adjust the scale of the integrator analog input range to the analog output range of the sensors.

In other embodiments, a reference circuit provides a reference charge for the integrator inputs.

DETAILED DESCRIPTION OF THE PREFERRED EMBODIMENTS

Figure 1:
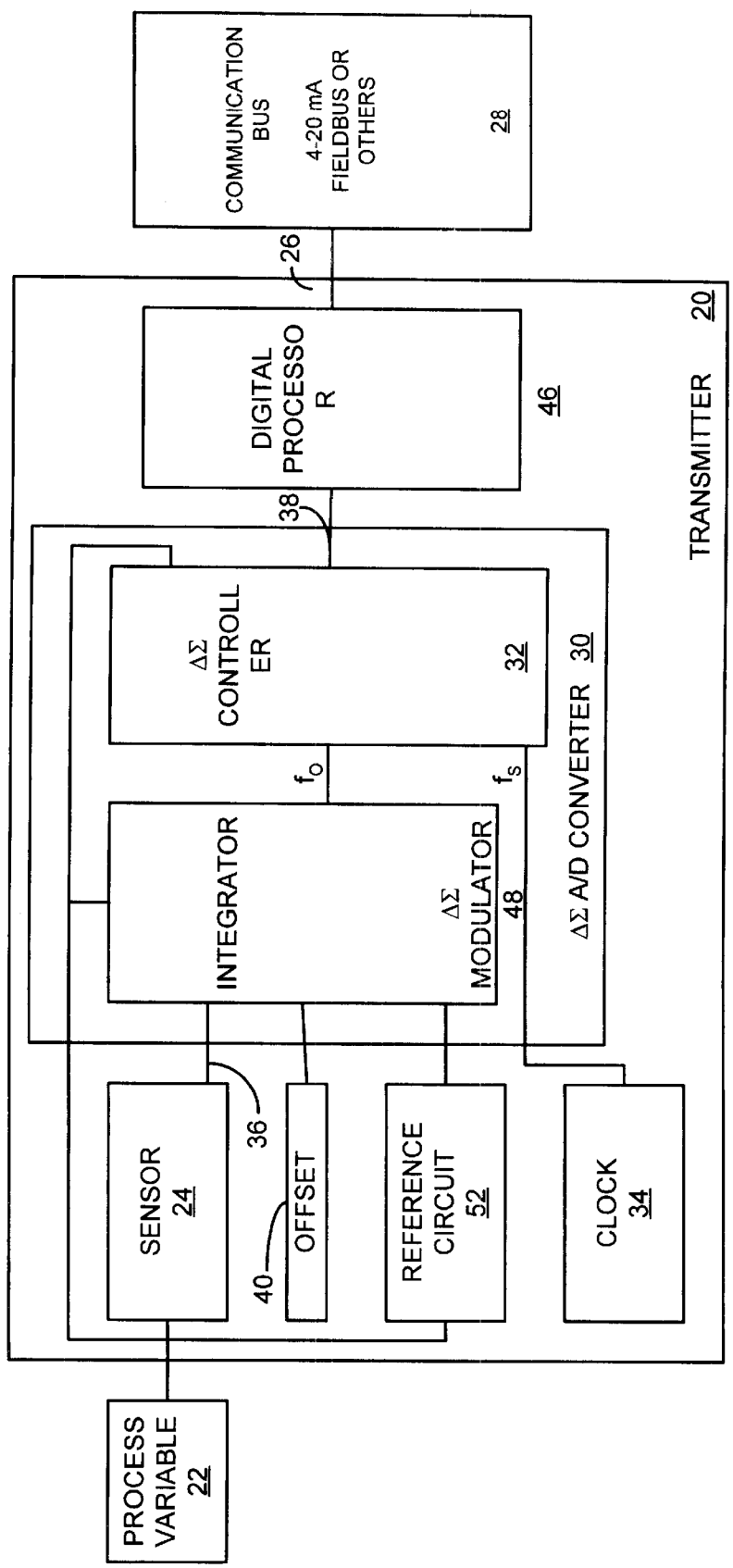
FIG. 1 is a block diagram of an industrial process control transmitter employing a delta-sigma converter according to the present invention.

FIG. 1 is a block diagram of a process variable transmitter 20 arranged to monitor one or more process variables 22 and generate one or more outputs 26 representing the sensed process variable. Transmitter outputs 26 are configured for transmission over long distances via a communications bus 28. Transmitter 20 includes a sensor 24 configured to monitor process variables 22 associated with fluids, such as slurries, liquids, vapors and gasses in industrial processing plants, such as chemical, pulp, petroleum, gas, pharmaceutical, food and other fluid processing plants. Process variables of such fluids that are monitored include pressure, strain, temperature, flow, level, pH, conductivity, turbidity, density, concentration, chemical composition and other properties of the fluids. Communication bus 28 may be a 4–20 ma current loop that powers the transmitter, or a FieldBus connection, a HART protocol communication or a fiber optic connection to a controller, a control system or a read-out (not shown). In transmitters powered by a two-wire communication loop 28, power must be maintained at a low level. to provide safety in explosive atmospheres. Circuits that conserve energy, such as delta-sigma circuits, are especially desirable when such low power is employed.

Transmitter 20 includes an analog-to-digital converter (A/D) converter circuit 30 of the type known as a delta-sigma circuit. As used herein, delta-sigma circuits means circuits that generate an alternating polarity balancing current to an integrator under the control of a clocked controller.

Thus, delta-sigma A/D circuit 30 includes a delta-sigma modulator 48 having an integrator input 36 coupled to receive an analog signal $V_{DC}$ from sensor 24 representative of the monitored process variable. Clock 34 generates a clock output. at frequency $f_S$ to controller 32. Controller 32 is coupled to modulator 48 to generate a converted digital output 38 that digitally represents the analog signal $V_{DC}$. In some arrangements, output 38 of controller 32 generates two pulse counts N1 and N2 such that the quantity N1(N1+N2) represents the sensed process variable. The output 38 of delta-sigma A/D converter circuit 30 is coupled to digital processor 46 that processes the digital signal and conditions the processed signal for transmission at output 26 in a formatting compatible to communication bus 28. In some applications, offset circuit 40 and reference 52 may be coupled to modulator 48 to offset noise frequency from the baseband of signals from sensor 24. Such an offset circuit and reference are fully described in the aforementioned Gaboury application.

Figure 2:
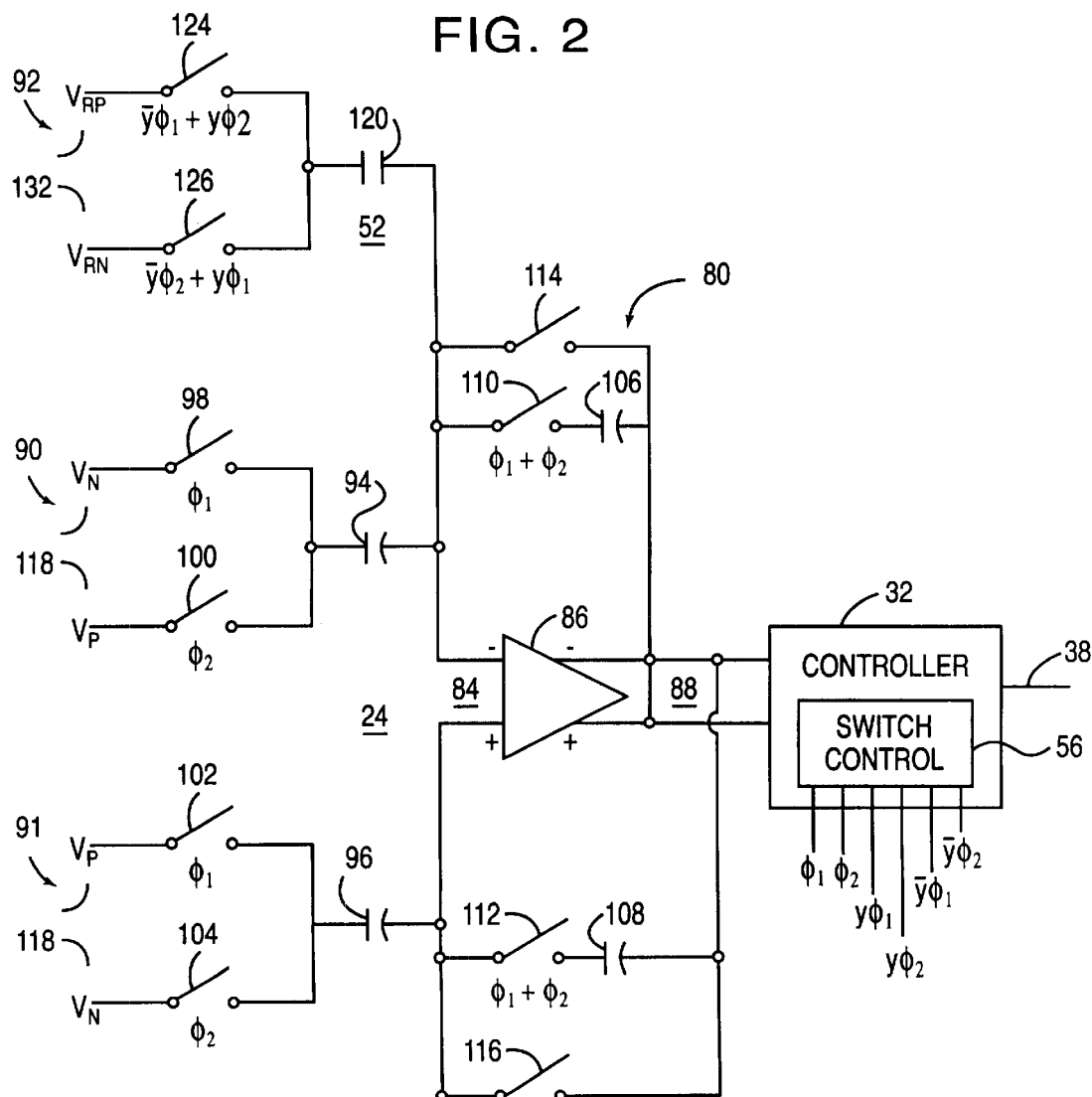
FIG. 2 is a circuit diagram of a portion of a delta-sigma converter described in the aforementioned Gaboury application.

FIG. 2 illustrates a portion of a delta-sigma modulator 48 described in the aforementioned Gaboury application. Modulator 48 comprises an integrator 80 and charge packet generators 82. As explained in the above-mentioned Gaboury application, delta-sigma modulator 48 may include a plurality of modulator stages, each including an integrator 80 and one or more charge packet generators 82. Each charge packet circuit 82 is coupled to differential inputs 84 of modular differential amplifier 86 to derive a differential output 88. The input and output of amplifier 86 are complimentary type signals.

Figure 3:
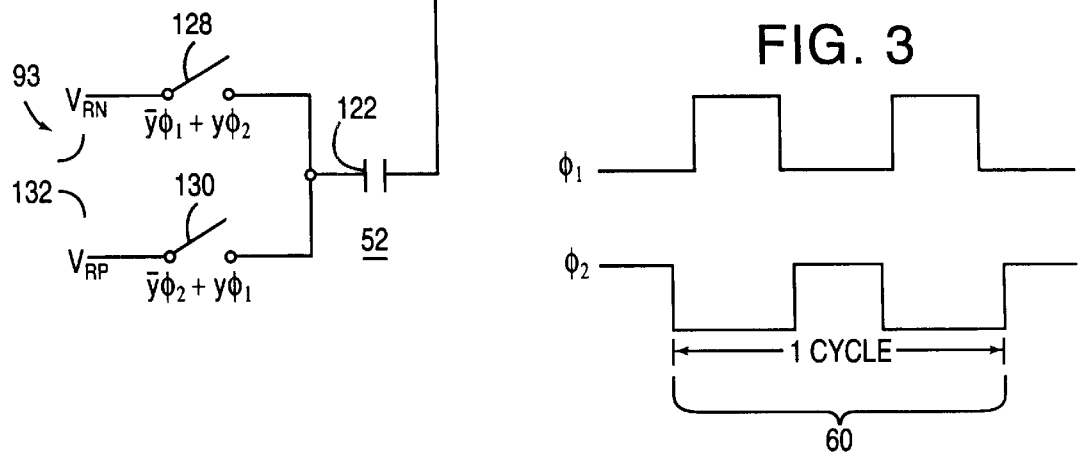
FIG. 3 is a timing diagram of the operation of the switches in a delta-sigma converter.

As shown in FIG. 2, charge packet generators 90 and 91 charge and discharge sensor capacitors 94 and 96 of sensor 24. Sensor capacitors 94 and 96 are each responsive to the process variable to store an electrical charge during a first phase $\Phi_1$ representative of the process variable at respective locations in the process plant. Sensor capacitors may, for example, be differential capacitors arranged to measure the difference in the process variable between two locations in the plant. Switches 98 and 102 operate to charge sensor capacitor 94 positively and to charge sensor capacitor 96 negatively during a first phase $\Phi_1$. Switches 100 and 104 operate to transfer the charge on capacitors 94 and 96 to respective inputs to amplifier 86 of integrator stage 80 during a second phase $\Phi_2$. Additionally, capacitor 94 is charged to $V_P$ and capacitor 96 is charged to $V_N$ during the second phase $\Phi_2$. Consequently, during the first phase $\Phi_1$ of the next cycle (while capacitors 94 and 96 are charging to $V_N$ and $V_P$, respectively) capacitors 94 and 96 transfer charges to the respective integrating capacitors 106 and 108 and the negative and positive inputs of amplifier 86. As shown particularly in FIG. 3, phases $\Phi_1$ and $\Phi_2$ are mutually exclusive portions of a charge cycle 60. Preferably, each phase $\Phi_1$ and $\Phi_2$ ends before the next phase begins.

Charge packet generator 92 includes reference capacitor 120 coupled through switch 124 to a positive reference voltage $V_{RP}$ of reference voltage source 132 and through switch 126 to a negative reference voltage $V_{RN}$ Of source 132. Similarly, charge packet generator 93 includes reference capacitor 122 coupled through switch 128 to positive reference voltage $V_{RP}$ and through switch 130 to negative reference voltage $V_{RN}$. Switches 124 and 128. are operated to conduction during one phase of each cycle and switches 126 and 130 are operated to conduction during the other phase of each cycle; which pair of switches operates depends or the positive or negative value of the previous output y at output 88 during the previous cycle. Thus, if the output y is negative ($\bar{y}$), switches 124 and 128 conduct during the $\Phi_1$ phase and switches 126 and 130 conduct during the $\Phi_2$ phase. Conversely, if the output y is positive (y), switches 124 and 128 conduct during the $\Phi_2$ phase and switches 126 and 130 conduct during the $\Phi_1$ phase. Controller 32 (FIG. 1) includes switch controller 56 that is operated by the output 88 of amplifier 86 to provide control signals $\Phi_1$, $\Phi_2$, $y\Phi_1$, $y\Phi_2$, $\bar{y}\Phi_1$, $\bar{y}\Phi_2$. Consequently, during the first phase $\Phi_1$ the charge transferred to integrator 80 is $$Q_{\Phi 1}=(V_P-V_N)C_{IN}\pm(V_{RP}-V_{RN})C_{REF}$$

and the charge transferred to integrator 80 during the $\Phi_2$ phase is $$Q_{\Phi 2}=(V_N-V_P)C_{IN}\pm(V_{RN}-V_{RP})C_{REF}.$$

Figure 4:
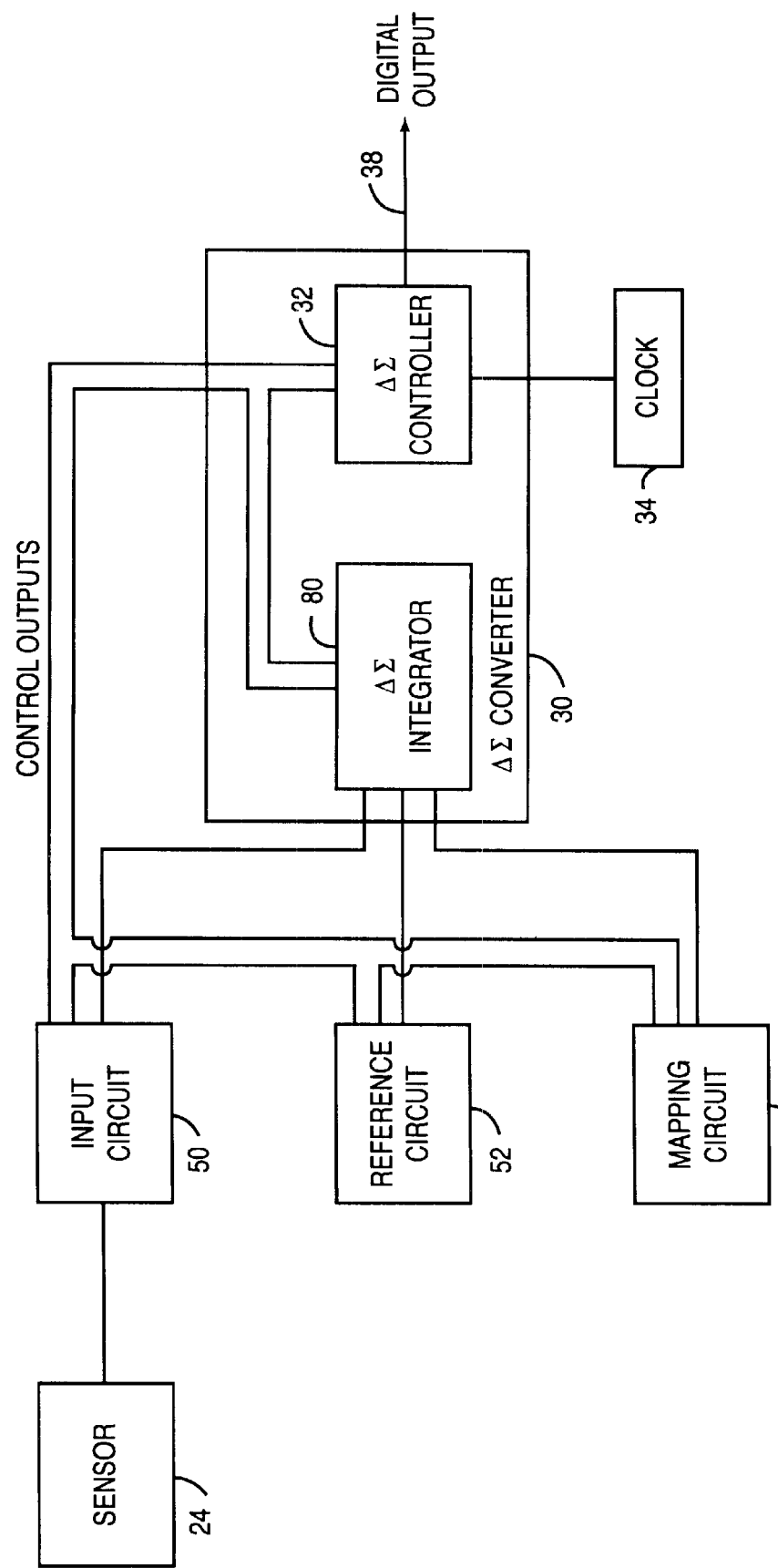
FIG. 4 is a block diagram of the sensor and delta-sigma converter according to the present invention.

The total charge transferred is a balanced charge representing the difference of $Q_{\Phi 1}$ and $Q\Phi_2$, $$Q_{OUT}=Q_{\Phi 1}-Q_{\Phi 2}=2(V_P-V_N)C_{IN}\pm 2(V_{RP}-V_{RN})C_{REF},$$

where $C_{IN}=C_{94}=C_{96}$ and $C_{REF}=C_{120} C_{122}$. Consequently, if the maximum range of the charge transferred by sensor capacitors 94 and 96 is between 0 and $(V_{RP}-V_{RN})C_{REF}$, the output of the delta-sigma converter extends between 0 volts $V_{RP}$, which is only half of the full range of the converter. The present invention, shown in FIG. 4, extends the range of the charge transfer to the full range of the converter As shown in FIG. 4, input circuit 50 is coupled to sensor 24, consisting of capacitors 90 and 92, to provide input to integrator 80. Reference circuit 52, consisting of charge packet generators 92 and 93 and their accompanying reference capacitors 120 and 122, is coupled to integrator 80. A mapping circuit 58 maps the input to integrator 80 to the full range of integrator 80. The output 88 of integrator 80 is supplied to delta-sigma controller 32, which includes switch control 56 to supply control signals $\Phi_1$, $\Phi_2$, $y\Phi_1$, $y\Phi_2$, $\bar{y}\Phi_1$, $\bar{y}\Phi_2$ to input circuit 50, reference circuit 52, mapping circuit 58 and integrator 80.

Figure 5:
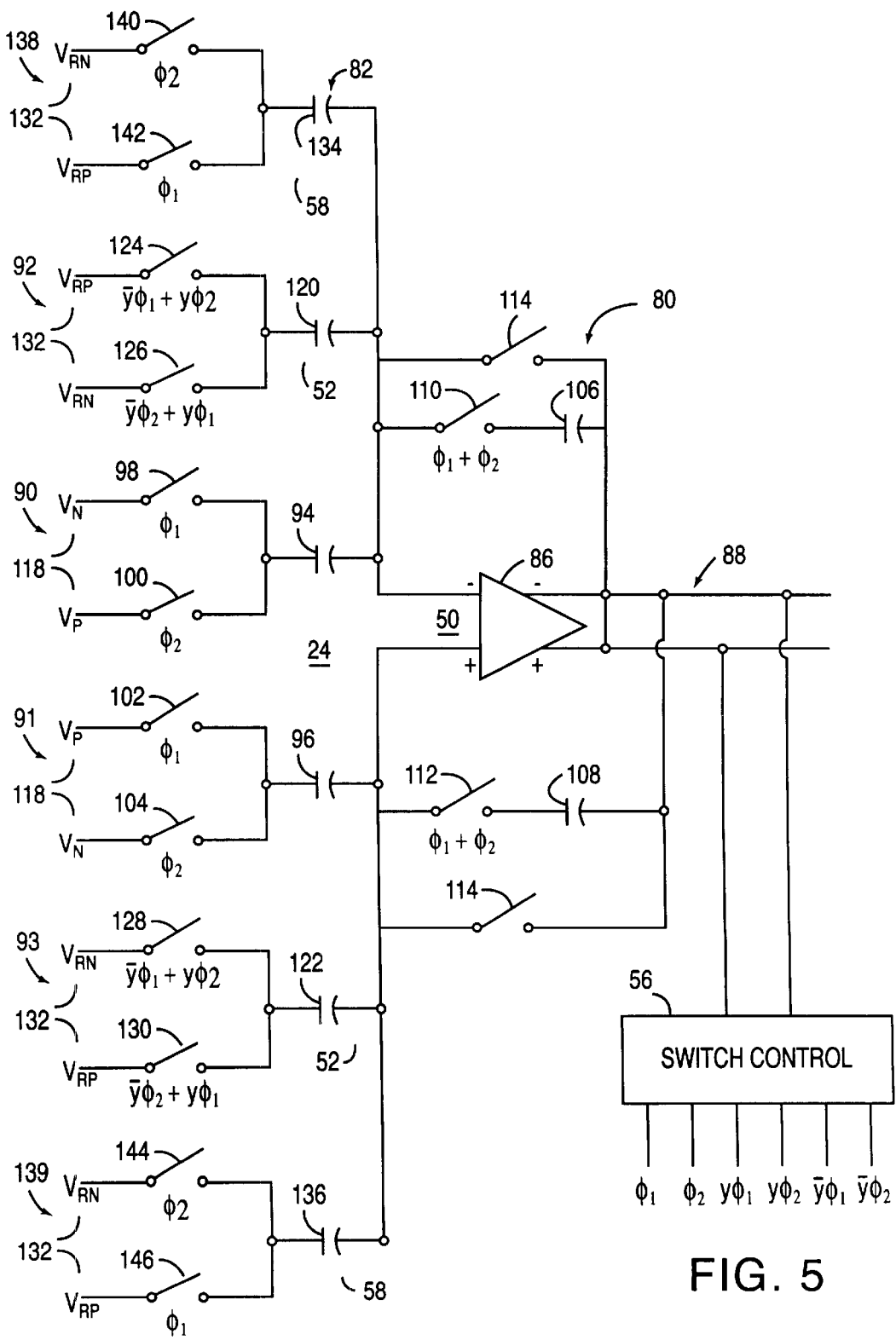
FIG. 5 is a circuit diagram of a portion of the sensor and delta-sigma converter shown in FIG. 4.

FIG. 5 illustrates the delta-sigma converter of FIG. 4 in greater detail. As shown in FIG. 5, mapping circuit 58 includes mapping capacitors 134 and 136 and associated charge packet generators 138 and 139. Charge packet generator 138 includes switches 140 and 142 coupling mapping capacitor 134 to the negative reference voltage $V_{RN}$ and positive reference voltage $V_{RP}$, respectively, of reference voltage source 132. Similarly, charge packet generator 139 includes switches 144 and 146 coupling mapping capacitor 136 to voltage $V_{RN}$ and to voltage $V_{RP}$, respectively. Switches 142 and 146 are operated to conduction during phase $\Phi 1$, and switches 140 and 144 are operated to conduction during phase $\Phi 2$ of each cycle. Thus, unlike reference capacitors 120 and 122 whose charge is dependant on the polarity of the signal at output 88 of amplifier 86, mapping capacitors 134 and 136 are charged oppositely of respective capacitors 94 and 96, respectively, to thereby subtract from the charge on respective capacitors 94 and 96. Consequently, the charge transferred to integrator 80 is $$Q_{OUT}=2(V_P-V_N)C_{IN}2(V_{RP}-V_{RN})C_{REF}-2(V_{RP}V_{RN})C_{OS},$$

where $C_{IN}=C_{94}=C_{96}$, $C_{REF}=C_{120}=C_{122}$ and $C_{MAP}=C_{134}=C_{136}$.

The values of the capacitances of the reference capacitors 120. and 122 and of the mapping capacitors 134 and 136 and the voltage values of voltage sources 118 and 132 are selected such that the charges transferred to differential amplifier 86 by each of the reference capacitors 120 and 122 and the mapping capacitors 134 and 135 is one-half of the charge transferred by each of the sensor capacitors 94 and 96. Conveniently, this is accomplished by establishing voltage source 118 equal to voltage source 132 and setting the capacitance of capacitors reference capacitors 120 and 122 and mapping capacitors 134 and 136 equal to about one-half the nominal capacitance of each of sensor capacitors 94 and 96. Hence, each reference and mapping capacitor provides a capacitance of one-half the expected capacitance of each sensor capacitor. Thus, $V_{RP}=V_P$ and $V_{RN}=V_N$, and $V_{RP}=V_P=-V_{RN}=-V_N$ and $C_{MAP}=C_{REF}=C_{IN}/2$. With $C_{MAP}$ and $C_{REF}$ both equal to $C_{IN}/2$, the midpoint of the charge packet generator range is set to 0 volts for the integrator stage of the delta-sigma converter and places the range of the sensor extends over the full range of the converter between $-(V_{RP}-V_{RN})$ and $+(V_{RP}-V_{RN})$. Thus, mapping circuit 58 adjusts the flow of charge from input circuit 50 to integrator circuit 80 to scale the analog input range of the integrator to the analog output range of sensor 40. More particularly, charge packet generators 138 and 139 supply charges that are opposite in polarity and one-half of the value of the charges supplied by the sensor charge packet generators 90 and 91 to translate the analog input range of integrator 80 for the sensor. Consequently, the present invention utilizes the full range of the delta-sigma converter without the use or inaccuracies of analog amplifying and offsetting circuits.

Although the present invention has been described with reference to preferred embodiments, workers skilled in the art will recognize that changes may be made in form and detail without departing from the spirit and scope of the invention.

What is claimed is:

1. A delta-sigma converter providing a digital signal representative of a process variable, comprising:
    an integrator circuit having an analog input range and providing an integrator output;
    a controller responsive to an output from the integrator circuit to generate a digital output within a digital output range, the digital output range representing the analog input range, the controller providing control signals, the integrator circuit being responsive to the control signals to provide the integrated output to the controller;
    a sensor input circuit coupled to the integrator circuit and including a sensor having an analog sensor range, the sensor input circuit being responsive to the control signals to provide a balanced analog sensor signal within the analog sensor range to the integrator circuit, the balanced analog sensor signal being representative of the process variable; and
    a mapping circuit coupled to the integrator circuit and responsive to the control signals to map the analog input range to the analog sensor range.

2. The delta-sigma converter of claim 1, wherein the mapping circuit adjusts charge flow from the input circuit to the integrator circuit to scale the analog input range.

3. The delta-sigma converter of claim 2, wherein the mapping circuit translates the analog input range.

4. The delta-sigma converter of claim 1, further including a reference circuit coupled to the integrator circuit and responsive to the control signals to provide a balanced reference signal.

5. The delta-sigma converter of claim 1, wherein the integrator circuit has at least two differentially arranged inputs and the sensor comprises at least two sensor capacitors responsive to the process variable,
    the sensor input circuit includes a first charge packet generator coupled to each sensor capacitor arranged to supply charges of opposite polarity to respective ones of the integrator circuit inputs,
    the mapping input circuit includes at least two mapping capacitors and a second charge packet generator coupled to each mapping capacitor, the second charge packet generators being arranged with respect to the first charge packet generators to reduce the charge supplied by the first charge packet generators to the respective integrator circuit inputs.

6. The delta-sigma converter of claim 5, wherein each second charge packet generator is arranged to provide a charge to the respective integrator input that is opposite in polarity and about one-half the charge supplied by the respective first charge packet generator.

7. The delta-sigma converter of claim 5, wherein the first and second charge packet generators are operated by a supply voltage, and each mapping capacitor has a capacitance of one-half a nominal capacitance of each sensor capacitor.

8. The delta-sigma converter of claim 5, further including a reference circuit coupled to the integrator circuit and responsive to the control signals to provide a balanced reference signal.

9. The delta-sigma converter of claim 8, wherein the reference circuit includes at least two reference capacitors and a third charge packet generator coupled to each reference capacitor, the third charge packet generators being arranged with respect to the first charge packet generators to alter the charge supplied by the first charge packet generators to the respective integrator circuit inputs.

10. The delta-sigma converter of claim 9, wherein the controller further including a charge packet generator controller to operate the third. charge packet generators to selectively increase or decrease the charge supplied to the integrator circuit inputs by the first charge packet generators based on the integrator output.

11. The delta-sigma converter of claim 10, wherein each second charge packet generator is arranged to provide a charge to the respective integrator input that is opposite in polarity and about one-half the charge supplied by the respective first charge packet generator, and each third charge packet generator is arranged to provide a charge to the respective integrator input that is about one-half the charge supplied by the respective first charge packet generator.

12. The delta-sigma converter of claim 10, wherein the first, second and third charge packet generators are operated by a supply voltage, and each mapping capacitor and each reference capacitor has a capacitance of one-half a nominal capacitance of each sensor capacitor.

13. An industrial process control transmitter arranged to be coupled to a central station by a two-wire communication link, the transmitter comprising:
    a sensor input circuit including a sensor responsive to control signals to provide a balanced analog sensor signal within an analog sensor range representative of the process variable;
    an integrator circuit coupled to the sensor input circuit and responsive to the control signals to provide an integrator output representative of the process variable within an analog input range;
    a controller responsive to the integrator output to generate a digital output within a digital output range, the digital output range representing the analog input range, the controller providing the control signals;
    a mapping circuit coupled to the integrator circuit and responsive to the control signals to map the analog input range to the analog sensor range; and a transceiver coupled to the processor and to the communication link for transmitting information from the processor to the central station.

14. The industrial process control transmitter of claim 13, wherein the mapping circuit adjusts charge flow from the input circuit to the integrator circuit to scale the analog input range.

15. The industrial process control transmitter of claim 13, further including a reference circuit coupled to the integrator circuit and responsive to the control signals to provide a balanced reference signal.

16. The industrial process control transmitter of claim 13, wherein the integrator circuit has at least two differentially arranged inputs and the sensor comprises at least two sensor capacitors responsive to the process variable, the sensor input circuit includes a first charge packet generator coupled to each sensor capacitor arranged to supply charges of opposite polarity to respective ones of the integrator circuit inputs, the mapping input circuit includes at least two mapping capacitors and a second charge packet generator coupled to each mapping capacitor, the second charge packet generators being arranged with respect to the first charge packet generators to reduce the charge supplied by the first charge packet generators to the respective integrator circuit inputs.

17. The industrial process control transmitter of claim 16, wherein each second charge packet generator is arranged to provide a charge to the respective integrator input that is opposite in polarity and about one-half the charge supplied by the respective first charge packet generator.

18. The industrial process control transmitter of claim 16, wherein the first and second charge packet generators are operated by a supply voltage, and each mapping capacitor has a capacitance of one-half a nominal capacitance of each sensor capacitor.

19. The industrial process control transmitter of claim 16, further including a reference circuit coupled to the integrator circuit and responsive to the control signals to provide a balanced reference signal.

20. The industrial process control transmitter of claim 19, wherein the reference circuit includes at least two reference capacitors and a third charge packet generator coupled to each reference capacitor, the third charge packet generators being arranged with respect to the first charge packet generators to alter the charge supplied by the first charge packet generators to the respective integrator circuit inputs.

* * * * *